United States Patent
Massarella et al.

(10) Patent No.: US 10,680,669 B2
(45) Date of Patent: Jun. 9, 2020

(54) FREQUENCY DISCRIMINATOR

(71) Applicant: CRFS LIMITED, Cambridge (GB)

(72) Inventors: Alistair Massarella, Cambridge (GB);
Daniel Timson, Cambridge (GB);
Keith Alexander, Cambridge (GB);
Danielius Bilinskas, Cambridge (GB);
Daniel Pisi, Cambridge (GB)

(73) Assignee: CRFS LIMITED, Cambridge (GB)

( * ) Notice: Subject to any disclaimer, the term of this patent is extended or adjusted under 35 U.S.C. 154(b) by 2 days.

(21) Appl. No.: 15/556,769

(22) PCT Filed: Mar. 4, 2016

(86) PCT No.: PCT/GB2016/050566
§ 371 (c)(1),
(2) Date: Sep. 8, 2017

(87) PCT Pub. No.: WO2016/142658
PCT Pub. Date: Sep. 15, 2016

(65) Prior Publication Data
US 2018/0062680 A1 Mar. 1, 2018

(30) Foreign Application Priority Data
Mar. 9, 2015 (GB) .................................. 1503939.9

(51) Int. Cl.
*H04B 17/00* (2015.01)
*H04B 1/10* (2006.01)
(Continued)

(52) U.S. Cl.
CPC ......... *H04B 1/1027* (2013.01); *G01R 23/165* (2013.01); *H04B 1/7156* (2013.01)

(58) Field of Classification Search
CPC .... H04B 1/1027; H04B 1/7156; H04B 17/00; G01R 23/165
See application file for complete search history.

(56) References Cited

U.S. PATENT DOCUMENTS 3,215,934 A   11/1965  Sallen
5,418,536 A    5/1995  Lisle et al.
(Continued)

FOREIGN PATENT DOCUMENTS

GB    2237649 A   5/1991
RU    2487481 C1  7/2013

OTHER PUBLICATIONS

Coombined Search and Examination report of British application No. 1503939.9 dated Jul. 27, 2015.
(Continued)

*Primary Examiner* — Pablo N Tran
(74) *Attorney, Agent, or Firm* — Burr & Forman, LLP

(57) ABSTRACT

A frequency discriminator is described. The frequency discriminator comprises a power splitter (2) for splitting a signal into a plurality of paths ($4_0$, $4_1$, $4_2$, ..., $4_n$). At least two of the plurality of paths ($4_1$, $4_2$, ..., $4_n$) include respective filters ($12_1$; $12_2$, ..., $12_n$) having different frequency characteristics which are configured to provide respective filtered signals to respective power detectors ($16_1$, $16_2$, ..., $16_n$). The frequency discriminator comprises an analogue-to-digital conversion section (8) which is configured to receive values of measured powers from the power detectors, to generate digital values of measured powers and to provide the digital values of measured powers to a digital processing section (10). The digital processing section is configured to estimate a value (11) of at least one frequency in the signal in dependence on the digital values, for example the ratio of the digital values, of measured powers and on frequency responses ($20_1$, $20_2$, ..., $20_n$; FIG. 2) of the filters.

38 Claims, 16 Drawing Sheets

(51) Int. Cl.
*H04B 1/71* (2011.01)
*G01R 23/165* (2006.01)
*H04B 1/7156* (2011.01)

(56) References Cited

U.S. PATENT DOCUMENTS

| | | | | |
|---|---|---|---|---|
| 5,465,410 | A * | 11/1995 | Hiben | H03G 5/24 455/182.2 |
| 6,477,214 | B1 * | 11/2002 | Fowler | G01R 23/167 375/350 |
| 7,369,836 | B2 * | 5/2008 | Suganuma | H04B 1/1036 455/254 |
| 2005/0243897 | A1 * | 11/2005 | Lomp | H04B 1/707 375/146 |
| 2005/0286666 | A1 * | 12/2005 | Ryu | H04B 7/002 375/350 |
| 2009/0030628 | A1 | 1/2009 | Simpson | |
| 2011/0053538 | A1 | 3/2011 | Armitage et al. | |

OTHER PUBLICATIONS

International Search Report and Written Opinion of PCT/GB2016/050566 dated Jun. 9, 2016.
Examination report from corresponding British application No. 1503939.9 dated Apr. 17, 2019.

* cited by examiner

FREQUENCY DISCRIMINATOR

FIELD OF THE INVENTION

The present invention relates to a frequency discriminator. The present invention also relates to a detector which employs one or more frequency discriminators. The present invention further relates to a system which uses one or more detectors which employ one or more frequency discriminators.

BACKGROUND

In many applications, such as radar warning receivers (RWRs), there is a need to detect short-pulse signals with high probability.

Frequency-swept detectors and spectrum monitors are not well-suited to being short-pulse signal detectors since they suffer low dwell times in each frequency band.

Short-pulse signals can be detected using a digital instantaneous frequency measurement (IFM) technique based on an analogue frequency discriminator and reference is made to P. L. Herselman and J. E. Cilliers: "A Digital Instantaneous Frequency Measurement Technique using High-Speed Analogue-to-Digital Converters and Field Programmable Gate Arrays" (2007). A conventional frequency discriminator typically comprises a splitter, a delay line, a mixer and a low-pass filter. Using the splitter, delay line and mixer, an input signal is mixed with a delayed copy. The product is fed through a low-pass filter. The frequency of a single input tone can be found using a look-up table. However, one drawback of such a system is that it can "blinded" by an extra input tone. Another drawback is that such a system tends to suffer from having a limited dynamic range.

US 2011/0053538 A1 describes a high-speed frequency sensor. The sensor comprises a plurality of filters allowing passage of signals over a different band of frequencies and a plurality of detectors, each associated with a respective filter. If the incident RF signal results in a signal in the band of frequencies passed by a particular filter, the detector associated with that filter generates an output signal. This indicates in which of the frequency bands the incident RF signal has been detected. The precision of the frequency estimate is limited to one bin per filter, that is, the sensor determines only a range of frequencies within which the single frequency exists, the range being equal to the band of frequencies passed by the filter.

SUMMARY

The present invention seeks to provide an improved frequency discriminator for use in IFM.

According to a first aspect of the present invention there is provided a frequency discriminator. The frequency discriminator comprises a power splitter for splitting a signal into a plurality of paths. At least two of the plurality of paths include respective filters having different frequency characteristics which are configured to provide respective filtered signals to respective power detectors. The frequency discriminator comprises an analogue-to-digital conversion section which is configured to receive values of measured powers from the power detectors, to generate digital values of measured powers and to provide the digital values of measured powers to a digital processing section. The digital processing section is configured to estimate a value of at least one frequency in the signal in dependence on the digital values of measured powers and on frequency responses of the filters, for example, in dependence on at least one ratio of the digital values of measured powers and on frequency responses of the filter.

The frequency discriminator can be fabricated easily and cheaply and can provide good resolution. In particular, the frequency discriminator can allow the signal frequency to be estimated to precision which is finer than one bin per filter. This can be achieved by using the fact that a signal at any given frequency is passed at a detectable power level by at least two filters, at least one of which having an appreciable variation of gain dependent on frequency. The frequency discriminator can be considered to perform an estimate calculation which, in effect, fits non-zero measured powers to respective filter responses.

The plurality of paths may include a frequency-independent path to a respective power detector. The frequency-independent path may be a straight-through connection between the power splitter and the power detector, i.e. without a filter or other frequency-dependent component.

The power detectors may be logarithmic power detectors. Using logarithmic power detectors can help to provide a frequency discriminator which has a wide dynamic range.

The frequency discriminator may further comprise a plurality of sample-and-hold circuits. Each path may be provided with a respective sample-and-hold circuit which is configured to obtain a value of measured power from a respective power detector and to provide the value to the analogue-to-digital conversion section.

The analogue-to-digital conversion section may comprise a plurality of analogue-to-digital converters, each path provided with a respective analogue-to-digital converter. The analogue-to-digital conversion section may comprise an analogue-to-digital converter and a multiplexer having a plurality of inputs and an output, wherein the inputs are coupled to the plurality of paths and the output is coupled to an input of the analogue to digital converter.

The analogue-to-digital conversion section and the digital processing section, and optionally the sample-and-hold circuits, may be provided in a single integrated circuit, such as a microcontroller.

The digital processing section may comprise a microcontroller.

The digital processing section may be configured to find a filtered signal having a maximum measured power, the filtered signal corresponding to a frequency band and having a first and, optionally, a second filtered signal(s) in first and, optionally, second neighbouring frequency band(s).

The digital processing section may be configured to fit measured powers to the frequency responses of the filters so as to result in an error between the measured power and the frequency response, to minimise the error so as to identify the value of at least one frequency. The digital processing section may be configured to fit measured powers for the filtered signal and for the first and, optionally, second filtered signals.

The digital processing may be is configured to select one of the first and, optionally, second filtered signal(s) and to use an inverse transform of the frequency responses to identify the value of the frequency.

Each path may include an amplifier arranged to saturate for signals above a given signal level.

According to a second aspect of the present invention there is provided a detector comprising at least one frequency discriminator and an optional circuit configured to process signal(s) from the at least one frequency discriminator.

According to a third aspect of the present invention there is provided a detector comprising at least two frequency discriminators and a power splitter for splitting a signal into at least two detector paths, each detector path including one of the at least two frequency discriminators.

The detector may comprise at least one down converter, wherein at least one of the plurality of detector paths includes a respective down converter which is configured to provide a down converted signals to a respective frequency discriminator. This can be used to help ameliorate deterioration of filter performance at higher frequencies. This can help to increase bandwidth of sensitivity of the detector.

The detector may further comprise a limiting amplifier configured to receive an input signal and output the signal to the power splitter. This can allow a low-pass filter having a steeper roll-off to be used.

The detector may be sensitive to signals in a bandwidth between a lower frequency limit and an upper frequency limit, wherein the upper frequency limit is at least 10 GHz or at least 40 GHz.

The at least one processor may comprise at least one central processing unit (CPU). The at least one processor may comprise at least one field-programmable gate array (FPGA), at least one application-specific integrated circuit (ASIC), at least one microcontroller and/or at least one other integrated circuit.

Each path may include a filter for selecting a respective frequency range. The detector may comprise at least one band pass filter. The detector may comprise a plurality of band pass filters. One or more, or each, of the band-pass filters may have a bandwidth less than one octave (i.e. $f_H < 2 f_L$ where $f_H$ is the upper cut-off frequency and $f_L$ is the lower cut-off frequency). This can help to reject harmonics. One or more, or each, of the band-pass filters may have a bandwidth of between 2 and 4 GHz, for example, 3 GHz.

Each path may include an amplifier arranged to saturate at a given input level. Thus, a substantial proportion of dynamic range of a frequency discriminator can arise from frequency discrimination.

The detector may further comprise an input section for receiving an input signal and providing the signal to the detector power splitter. The input section may comprise a high-pass filter. The high-pass filter may have a cut-off frequency of 1 GHz. The input section may comprise a power limiter. The power limiter may comprise a two-stage low noise amplifier (LNA) arrangement.

According to a fourth aspect of the present invention there is provided a system comprising a detector and a receiver. The detector is configured, in response to receiving a signal which includes a component at a predetermined frequency, to identify the frequency and to cause the receiver to tune to a frequency band which includes the frequency.

The system may further comprise at least one further processor configured to characterise the signal and, in response to characterising the signal, to generate a pulse descriptor word. The system may further comprise at least one antenna coupled to the detector and the receiver. The system may be or be comprised in a radar warning receiver system.

According to a fifth aspect of the present invention there is provided a vehicle, such as an aircraft or ship, including the system.

According to a sixth aspect of the present invention there is provided a detection device comprising at least two detectors, each detector arranged to output a corresponding power level of an input signal and at least one processor configured to receive at least two measurements of power levels from respective detectors and to determine an angle of arrival.

The detection device may further comprise at least two antennas, each antenna coupled to a respective detector.

According to a seventh aspect of the present invention there is provided a system comprising a plurality of spaced detection devices and a controller, such as a computer, for receiving measurements of angle of arrival from one or more detection devices and which is configured to determine position of a signal source from measurements of angle of arrival.

According to an eighth aspect of the present invention there is provided a detection device comprising a detector and a processor configured to measure a time of arrival of a pulse received by the detector.

According to a ninth aspect of the present invention there is provided a system comprising a plurality of spaced detection devices and a controller for receiving measurements of time of arrival from one or more detection devices and which is configured to determine position of a signal source from measurements of time of arrival.

According to a tenth aspect of the present invention there is provided a detection device comprising a detector, a receiver for capturing a sample of a signal and at least one processor. The detector is configured, in response to receiving a signal, to cause the receiver to capture a sample of the signal.

The at least one processor may be configured to measure a time of arrival of a pulse received by the detector.

According to an eleventh aspect of the present invention there is provided a system comprising a plurality of spaced detection devices and a controller for receiving measured samples from one or more detection devices and which is configured to determine position of a signal source from the samples based on time difference of arrival.

The controller may be configured to determine position of the signal source from measurements of time of arrival.

According to a twelfth aspect of the present invention there is provided a detector, comprising an input terminal (which can be coupled to an antenna and which may be coupled to the antenna directly or via a transmit/receive switch), a processor, memory storing a unique identifier, a transmitter, at least one frequency discriminator configured to receive a signal from the input terminal and to output an instantaneous frequency signal to the processor, a diode configured to receive the signal from the input terminal, a comparator configured to compare an output of the diode with a threshold and, in dependence upon determining that the diode output exceeds the threshold, to output a wake-up signal to the processor and frequency discriminator. The processor is configured, in response to receiving the wake-up signal, to cause the transmitter to transmit the unique identifier and a value of frequency based on the instantaneous frequency signal.

The detector may further comprise an antenna coupled to the input terminal.

The transmitter may comprise an amplifier.

The detector may further comprise a transmit/receive switch.

According to a thirteenth aspect of the present invention there is provided a system comprising at least one detector, preferably at least two detectors which are spaced apart, and a central unit in communication with the at least one detector and configured to process a signal received from a one detector.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

Figure 1:
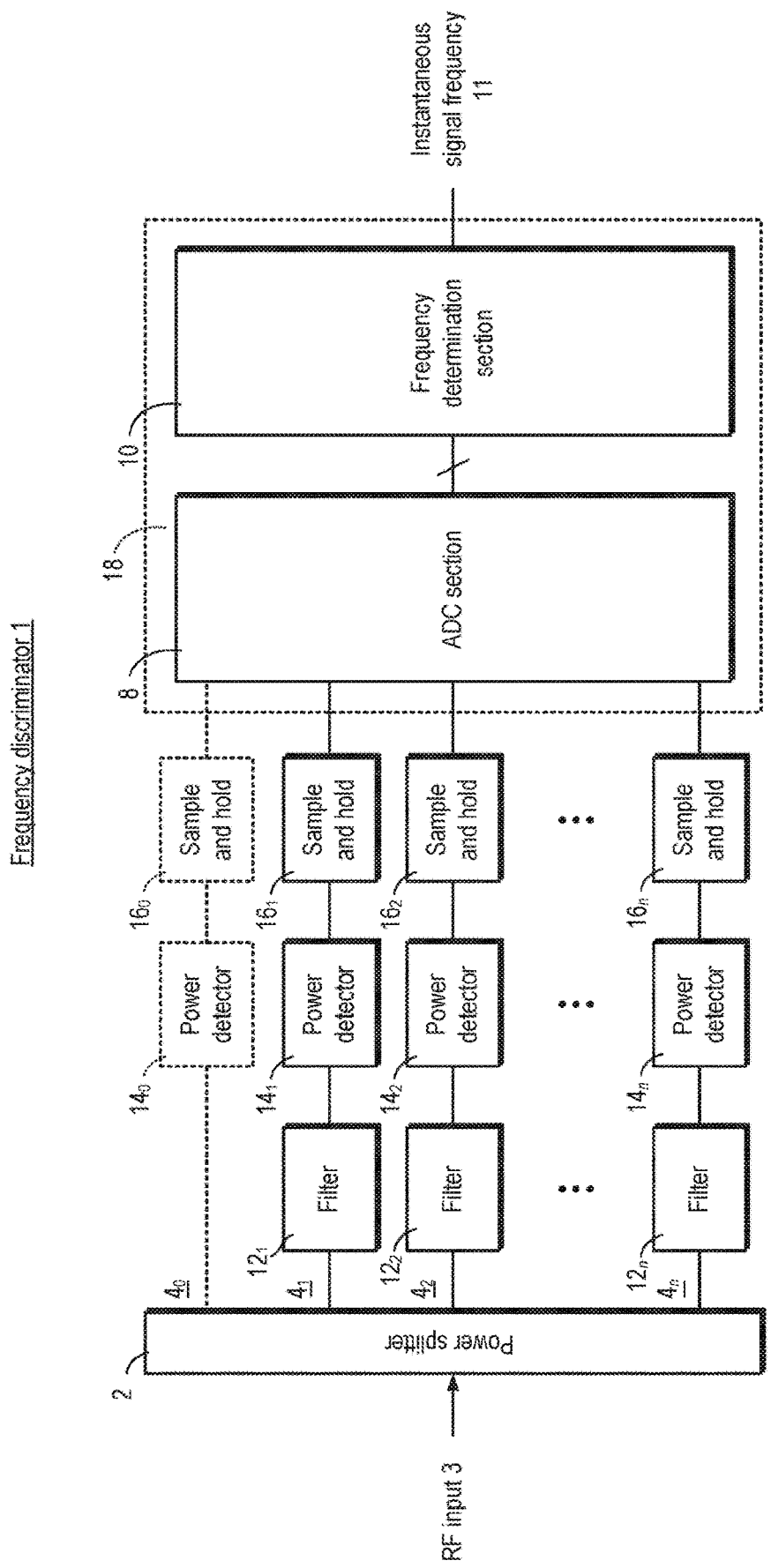
FIG. 1 is a schematic block diagram of a frequency discriminator including a set of filters.

Referring to FIG. 1, a frequency discriminator 1 is shown.

The frequency discriminator 1 includes a power splitter 2 which splits an RF signal 3 received from an antenna or other source and passes the RF signal (herein also referred to as the "input signal") into at least n paths $4_1, 4_2, \ldots, 4_n$, where n is an integer which is at least two, i.e. n≥2. In this example, n=12. The paths $4_1, 4_2, \ldots, 4_n$ feed into an analogue-to-digital converter (ADC) section 8 which in turn feeds digitalised signals to a digital-processing-based frequency determination section 10 which generates an estimate of instantaneous frequency 11.

Each path $4_1, \ldots, 4_n$ includes a filter $12_1, 12_2, \ldots, 12_n$. The input signal is fed into a filter $12_1, 12_3, \ldots, 12_n$ and each filter $12_2, 12_3, \ldots, 12_n$ feeds a filtered signal to a respective power detector $14_1, 14_2, \ldots, 14_n$.

Preferably, the power detectors $14_1, 14_2, \ldots, 14_n$ take the form of logarithmic power detectors. Examples of suitable power detectors include, for frequencies below 2.5 GHz, Linear Technologies® LT5534 ESC6# TRMPBF Power Detector and, for frequencies above 2.5 GHz, Analog Devices® AD8317ACPZ-R7 Log Detector. Using logarithmic power detectors can help to increase dynamic range of the frequency discriminator 1.

An optional unfiltered (or "straight-through") path $4_0$ may feed the input signal directly into a respective power detector $14_0$. As will be explained in more detail later, this can help to improve frequency estimation.

Outputs of the power detectors $14_1, 14_2, \ldots, 14_n$ are fed into respective sample-and-hold circuits $16_1, 16_2, \ldots, 16_n$ and the outputs of the sample-and-hold circuits $16_1, 16_2, \ldots, 16_n$ are fed into the ADC section 8.

The ADC section 8 and the frequency determination section 10 may be implemented in a single unit 18, such as a mixed-signal microcontroller.

Figure 2:
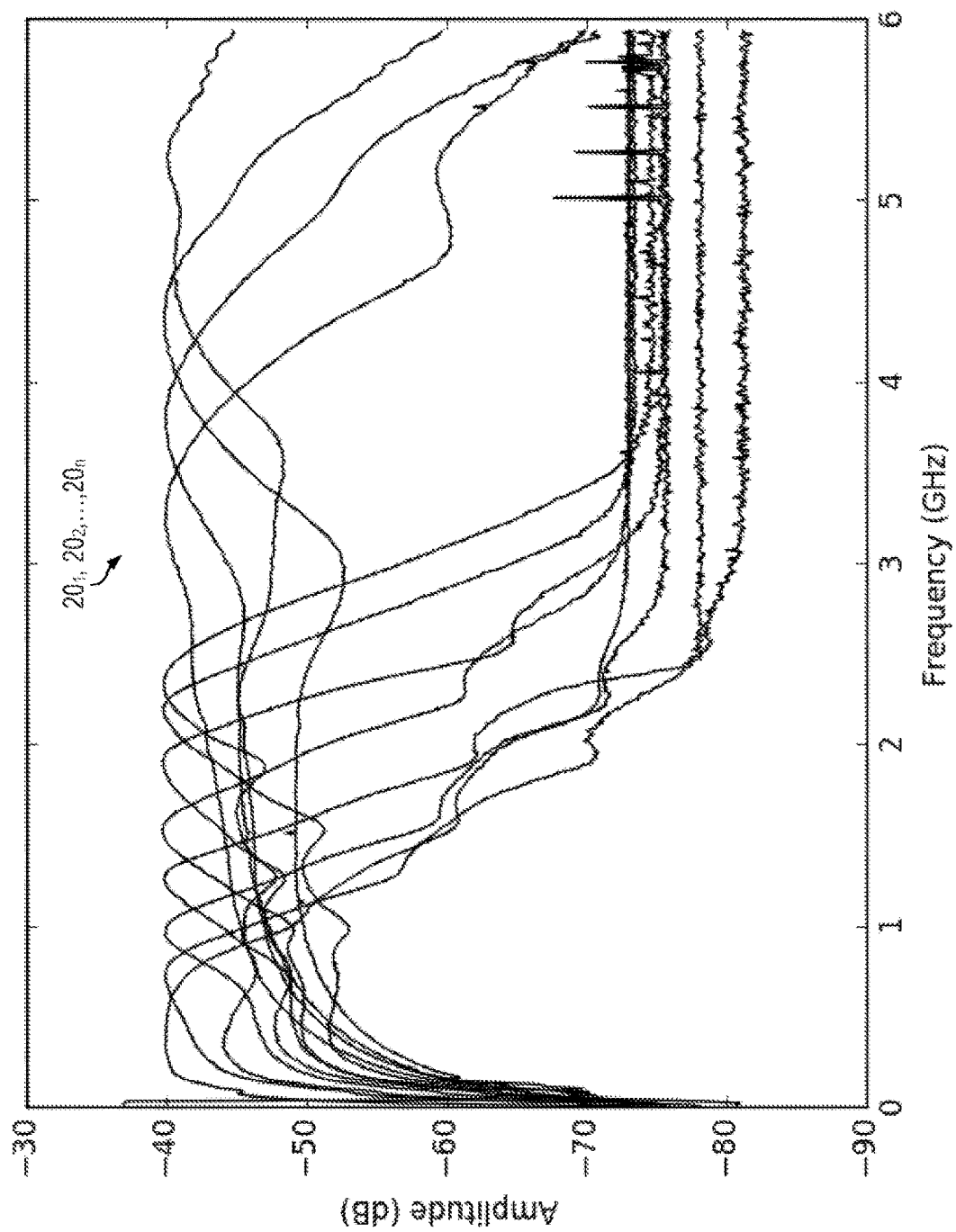
FIG. 2 illustrates measured frequency responses for a set of filters.

Referring also to FIG. 2, the filters $14_1, 14_2, \ldots, 14_n$ have different filter responses $20_1, 20_2, \ldots, 20_n$ (in this case, n=12) and divide a wide frequency band into a set of narrower bands so as to allow the power in bands to be compared and so determine the filter $14_m$ which returns the largest measured power $P_m$. The filters $14_1, 14_2, \ldots, 14_n$ include at least one pass band filter, for example at least two pass band filters, each having a different pass band. The filters $14_1, 14_2, \ldots, 14_n$ may include a low-pass filter and/or a high-pass filter. However, the low-pass filter and/or the high-pass filter may be omitted.

Figures 3, 4:
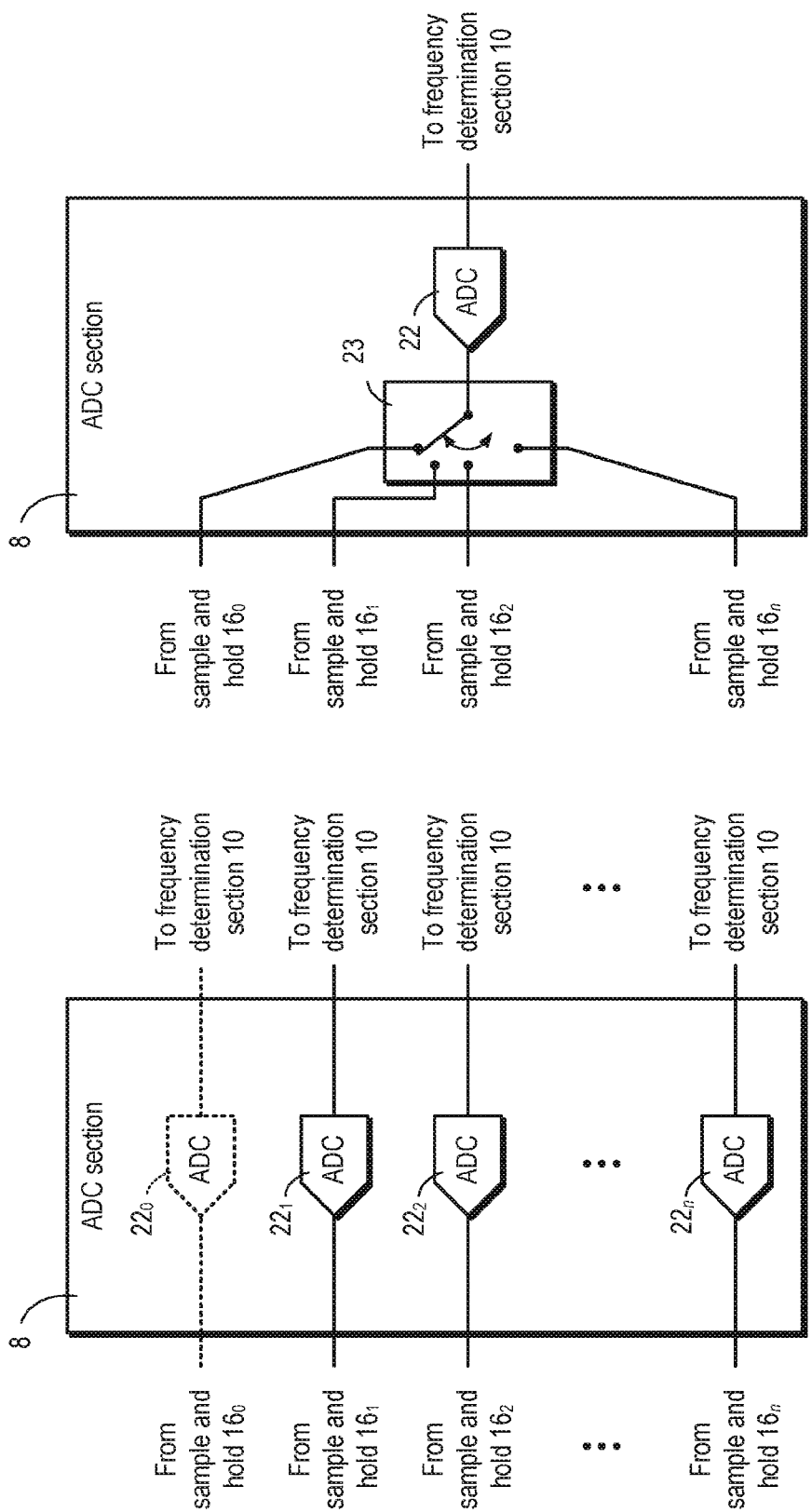
FIG. 3 is a schematic block diagram of a first analogue-to-digital converter section.
FIG. 4 is a schematic block diagram of a second analogue-to-digital converter section.

Referring to FIG. 3, the ADC section 8 may comprise n or, if a straight-though path $4_0$ is used n+1, analogue-to-digital converters (ADCs) $22_1, 22_2, \ldots, 22_n$. Thus, each ADC $22_1, 22_2, \ldots, 22_n$ receives a signal from a respective sample-and-hold circuit $16_1, 16_2, \ldots, 16_n$ and feeds digitised signals, in parallel, to the frequency determination section 10.

Referring also to FIG. 4, the ADC section 8 may comprise an ADC 22 and a multiplexer 23 having inputs from each sample-and-hold circuits $16_1, 16_2, \ldots, 16_n$.

As explained earlier, a mixed-signal microcontroller having one or more integrated ADCs may be used, such as a Texas Instruments® MSP430FR6989IPZ. However, a separate ADC integrated circuit can be used, such as a Maxim Integrated® MAX 11131 AT1+, 3 Msps, Serial, 16-channel, 12-bit ADC IC.

The sample-and-hold circuits $16_1, 16_2, \ldots, 16_n$ may be provided by the ADC section 8, which in turn may be provided by a microcontroller. For example, ADC(s) 22, $22_1, 22_2, \ldots, 22_n$ or a microcontroller 18 may have integrated sample-and-hold circuit(s).

Particularly if the ADC section 8 comprises a single ADC 22, the sample-and-hold circuits $16_1, 16_2, \ldots, 16_n$ can be used such that a microcontroller wakes up, for example every 1 second, and makes one set of measurements and then goes back to sleep. Thus, a set of measurements for all the filters can be made simultaneously.

Alternatively, the sample-and-hold circuits $16_1, 16_2, \ldots, 16_n$ can take measurements at the sample rate of the ADC(s) 22, $22_1, 22_2, \ldots, 22_n$, for example, at a rate of 1 to 10 MHz.

Figure 5:
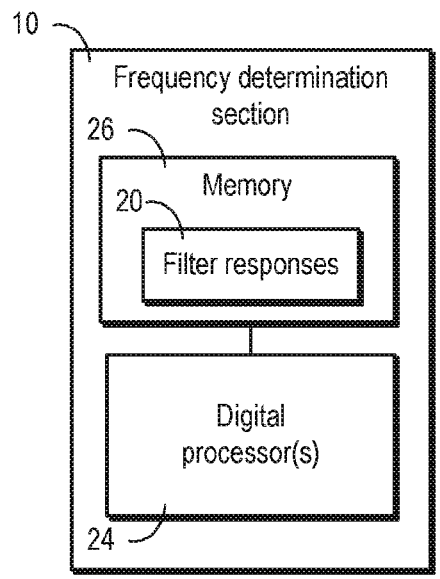
FIG. 5 is a schematic block diagram of a frequency determination section.

Referring to FIG. 5, the digital processing section 10 comprises at least one processor 24 and memory 26 which stores filter responses 20, i.e. power responses $20_1, 20_2, \ldots, 20_n$ for the filters $12_1, 12_2, \ldots, 12_n$ as a function of frequency. The responses 20 are preferably obtained by measurement as part of a calibration process.

The frequency determination section 10 can be implemented all or in part by a microcontroller or other suitable digital signal processing circuit, such as a system-on-a-chip, application specific integrated circuit (ASIC) or field-programmable gate array (FPGA). As explained earlier, ADC section 8 can be implemented, at least in part, in a mixed-signal microcontroller having one or more analogue-to-digital converters.

The frequency determination section 10 may comprise one or more programmable central processing units (CPUs) capable of executing code read from a non-transitory medium or memory to perform the function and operations taught herein. The frequency determination section 10 may be provided in microcontroller(s). The digital processing section 10 may include one or more circuits or circuitry, for example, field-programmable gate arrays (FPGAs) or application-specific integrated circuit(s) configurable or programmable to perform the functions and operations taught herein. The frequency determination section 10 may include a combination of one or more programmable CPUs and one or more configurable circuits or circuitry to perform the functions and operations taught herein.

The frequency determination section 10 identifies one or more frequency components in the input signal 3. This can be achieved in one or more ways, as will now be described in more detail:

Introduction

In the following, n power measurements are made using n filter paths $4_1, 4_2, \ldots, 4_n$ to estimate the frequency of the incoming signal(s). The measured powers (in dB) may be denoted $\{P_i, i=1, \ldots, n\}$ and the power responses $20_1, 20_2, \ldots, 20_n$ (in dB) of the filters $12_2, 12_3, \ldots, 12_n$ as $\{F_i(f), i=1, \ldots n\}$, where each $F_i(f)$ is a function of frequency, $f$. The filters $12_2, 12_3, \ldots, 12_n$ are ordered so that the centre frequency of the pass band of $F_i(f)$ increases with increasing i.

First Method

Figure 6:
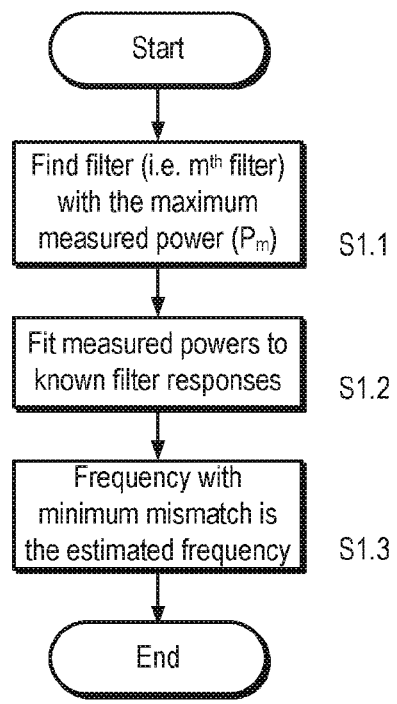
FIG. 6 is a process flow diagram of a first method of estimating a frequency in a signal.

FIG. 6 is a process flow diagram of a first method of estimating frequency which is performed by the digital processor(s) 24. In the following, for conciseness, only one digital processor 24 is described, although it will be understood that more than one digital processor 24 can be used.

In the first method, it is assumed that only one narrow-band signal is present during the measurement.

The processor 24 finds the maximum power $P_m$ returned by the $m^{th}$ filter $12_m$ (step S1.1). This implies that the frequency of the signal lies in a region where $F_m(f)$ takes larger values than all the other $F_i(f)$. In a typical case, this will be a single range of frequency. This frequency range is denoted $[f_a, f_b]$.

The processor 24 fits the measured powers to the known filter responses 20 within the given frequency range (step S1.2). Here, fitting involves trying different values of frequency and calculating a mismatch (or "error") between the measurements and the known responses. The frequency with the minimum mismatch is adopted as the estimated frequency of the signal (step S1.3).

The mismatch can be calculated using the maximum power, $P_m$, and the two neighbouring power measurements $P_{m-1}$ and $P_{m+1}$. In the case where m=1 or m=n, only one neighbour is used and the corresponding terms are omitted.

The mismatch $E(f)$ is given by equation 1 below, namely:

$$E(f) = w * abs(F_{m-1}(f) - P_{m-1} - (F_m(f) - P_m)) + (1-w) * abs(F_{m+1}(f) - P_{m+1} - (F_m(f) - P_m)) \quad (1)$$

where w is a positive, real weight less than one, for example, w=0.5. Another possible value for w (when m>1 and m<n) is $w = d_2/(d_1 + d_2)$, where $d_1 = F_m(f) - F_{m-1}(f)$ and $d_2 = F_m(f) - F_{m+1}(f)$.

Fitting proceeds by calculating $E(f)$ at a series of frequency values within the range $[f_a, f_b]$ in order to find a value of that minimises $E(f)$. A golden section search may be used, for example, as described in W. H. Press, S. A. Teukolsky, W. T. Vetterling & B. P. Flannery, *Numerical Recipes in C++*, pages 397 to 402 (3$^{rd}$ Edition, Cambridge University Press).

First, intermediate points $f_c$ and $f_d$ are chosen, given by $f_c = f_a + K * (f_b - f_a)$ and $f_d = f_b - K * (f_b - f_a)$. The constant K is given approximately by $K = (3 - \sqrt{5})/2 = 0.38197$. $E(f_c)$ and $E(f_d)$ are calculated. If $E(f_c) < E(f_d)$, then the function minimum is "bracketed" by the triple $(f_a, f_c, f_d)$. Otherwise, it is bracketed by $(f_c, f_d, f_b)$. In either case, a new frequency value $f'$ within the larger of the two intervals in the triple is chosen or determined. This new value is again at a fraction K into that interval. $E(f')$ is calculated. The four points are relabelled as $(f_a, f_b, f_c, f_d)$ and the process proceeds as before, choosing a triple that brackets the minimum. This successive narrowing of the bracketing interval terminates when the value of $E(f)$ at the centre point of a triple is within a predefined tolerance of the values at the end points or when a maximum number of iterations have been performed. The resulting frequency estimate of the signal is the frequency of the centre point of the final triple.

The frequency estimate is at a finer precision than one bin per filter, that is, it is more precise than simply taking the estimated frequency of the signal to be within the bandwidth of the filter which returns the maximum measured power. The frequency estimate can achieve greater precision than the detection bandwidths of the filters and is not limited by the bandwidths of the filters.

The following points are noted in relation to the first method:

The form of the expression for $E(f)$ results from the need to use power ratios (i.e. differences in dB) owing to the fact that the power of the signal is a priori unknown.

The values of intermediate frequencies at which $E(f)$ are calculated are given only approximately by the above expressions. In practice, the nearest available point at which the $F_n(f)$ are tabulated are used.

It is possible to modify the first method in various ways, for example:

Equation 1 above for $E(f)$ may be modified to calculate square error, namely:

$$E(f) = w*(F_{m-1}(f) - P_{m-1} - (F_m(f) - P_m))^2 + (1-w)*(F_{m+1}(f) - P_{m+1} - (F_m(f) - P_m))^2 \quad (1')$$

The measurement set $\{P_i, i=1 \ldots n\}$ may be modified by adding a positive constant $A_i$ to each value, to form a new set $\{P_i + A_i, i=1 \ldots n\}$, while at the same time adding the same constants to the filter responses used in the calculation: $\{F_i(f) + A_i, i=1 \ldots n\}$. This is equivalent to shifting each response in the graph of responses by a given vertical amount $A_i$ or to multiplying the (linear power) filter responses by an equivalent factor. In the calculation, this has the effect of modifying the regions in which each filter attains a higher power response than all the others. The performance of the algorithm may be superior for particular choices of the $\{A_i, i=1 \ldots n\}$. One example good choice is to make the peaks of all the filter responses to be at an equal level.

It is possible to use more than the three measurements $\{P_{m-1}, P_m, P_{m+1}\}$ in the calculation of $E(f)$, for example by adding additional terms proportional to abs($F_i(f)-P_i-(F_m(f)-P_m)$), for i<m−1 or i>m+1.

In the case where the frequency discriminator i (FIG. 1) includes a straight-through path $4_0$ (FIG. 1), i.e. one where a filter is replaced by a straight connecting path or a frequency-independent element such as an attenuator, into the log power detector 14 and sample-and-hold 16, the measurement $P_0$ and response $F_0(f)$ can be used in the calculation. It is noted that $F_0(f)$ will be approximately independent of frequency $f$. For example $E(f)$ may be of the form:

$$E(f)=\Sigma_i \text{abs}(F_i(f)-P_i-(F_0(f)-P_0)) \quad (2)$$

where the sum is over i in some set such as i in {m−1, m, m+1} or other sets. As before, a squaring function may replace the abs( ) function.

At the end of step S1.1, the measured power levels of the two neighbouring filters ($P_{m-1}$ and $P_{m+1}$) can be compared. If $P_{m-1} > P_{m+1}$, then the frequency of the signal must lie in the interval of $[f_a, f_x]$, where $f_x$ is the cross-over frequency point at which $F_{m-1}(f)=F_{m+1}(f)$. Otherwise, the signal frequency must lie in the range $[f_x, f_b]$. The smaller range thus calculated may then be used as the starting point for the fitting search process.

Second Method

Figure 7:
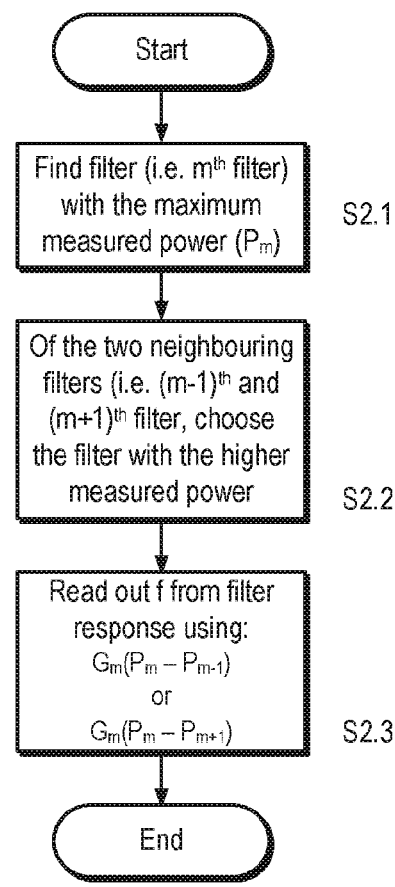
FIG. 7 is a process flow diagram of a second method of estimating a frequency in a signal.

FIG. 7 is a process flow diagram of a second method of estimating frequency which is performed by the processor(s) 24. In the following, for conciseness, only one digital processor 24 is described, although it will be understood that more than one digital processor 24 can be used.

The second method can help avoid the need for a search in frequency space. It assumes that the functions $D_m(f)=(F_m(f)-F_{m-1}(f))$, m=2 . . . n are known (in the frequency ranges where $F_m(f)$ and $F_{m-1}(f)$ attain the two highest values) and that their inverses $G_m(p)$, m=2 . . . n have been stored and are available in the calculation. That is, $G_m(D_m(f))=f$.

The processor 24 find the maximum power $P_m$ (step S2.1). This implies that the frequency of the signal lies in a region where $F_m(f)$ takes larger values than all the other $F_i(f)$. In a typical case, this will be a single range of frequency. This frequency range is denoted $[f_a, f_b]$.

Of the two neighbouring filters i=m−1 and i=m+1, choose the one with the higher measured power $P_i$ (step S2.2). As explained in relation to the first method, the signal frequency lies, in case (1), within the range $[f_a, f_x]$ if $P_{m-1} > P_{m+1}$ or, in case (2), within $[f_x, f_b]$, if $P_{m+1} > P_{m-1}$.

Within this range, the processor 24 uses the stored values of the inverse function to derive a frequency estimate directly, i.e. $f=G_m(P_m-P_{m-1})$ in case (1) and $f=G_m(P_m-P_{m+1})$ for case (2) (step S2.3).

The two filters used may be the second and third highest response at each frequency (or the two neighbours of the highest). These responses are likely to be varying at a greater rate with respect to frequency, thus potentially improving estimation accuracy.

In the case where a straight-through path $4_0$ (FIG. 1) is included, the second method may be modified to use $P_0$ and $F_0(f)$ together with either the highest or second highest response filter in the range in question, as the two responses in the definition of $D_m(f)$.

Third Method

A third method is the same as the first method except that the golden section search is replaced by a simple linear search going through a set of candidate frequencies in turn and picking the minimum mismatch value $E(f)$.

In the previous methods, it is assumed that there is only one signal. However, the processes may be modified to accommodate two or more simultaneous signals.

In a first case, two signals may be widely separated in frequency. This effectively splits the estimation process into two disjoint processes, each of which proceeds in any of the manners hereinbefore described. The separation in frequency is sufficient to ensure that the responses of the filters that have high responses for the first signal are very low for the second signal and vice versa.

In a second case, two signals are close in frequency. In this case, the processor 24 may use multiple frequency estimation calculations using different sets of filter outputs to check for consistency. If they disagree, then the processor 24 discards that set of measurements, indicating a multiple signal clash condition. Alternatively, the processor 24 may use a modified assumption and match measurements with known responses accordingly.

This can be done by defining a two frequency mismatch function $E(f_1, f_2)$, e.g. $E(f_1, f_2)=E(f_1)+E(f_2)$ or $E(f_1, f_2)=\text{sqrt}(E(f_1)^2+E(f_2)^2)$ and searching over two-dimensional frequency space $\{f_1, f_2\}$, looking for the minimum value of $E(f_1, f_2)$.

Detector 28

Figure 8:
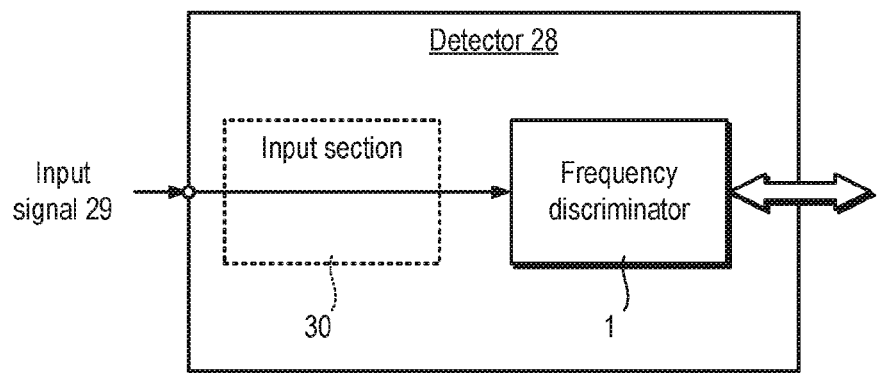
FIG. 8 is a schematic block diagram of a detector which includes a frequency discriminator.

Referring to FIG. 8, a detector 28 is shown. The detector 28 receives an input signal 29 which can be a combination of different signals. The detector 28 includes an optional input section 30 which can, for example filter and/or limit the input signal 29. The detector 28 may include one or more frequency discriminators 1. The detector 28 may include a processor or processing device.

Figure 9:
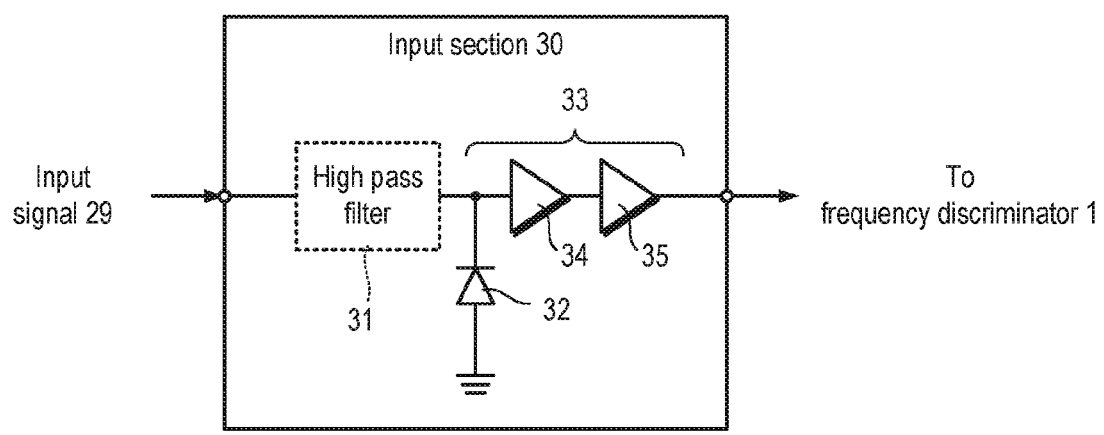
FIG. 9 is a schematic diagram of an optional input section of the detector shown in FIG. 8.

Referring to FIG. 9, the input section 30 is shown in more detail. The input section 30 includes an optional high-pass filter 31, for example, having a cut-off frequency $f_c$ of 1 GHz. The input section 30 includes a diode 32 to ground which provides protection against overload and a power limiter 33 comprising, for example, first and second low-noise amplifiers (LNA) 34, 35 arranged in series.

Figure 10:
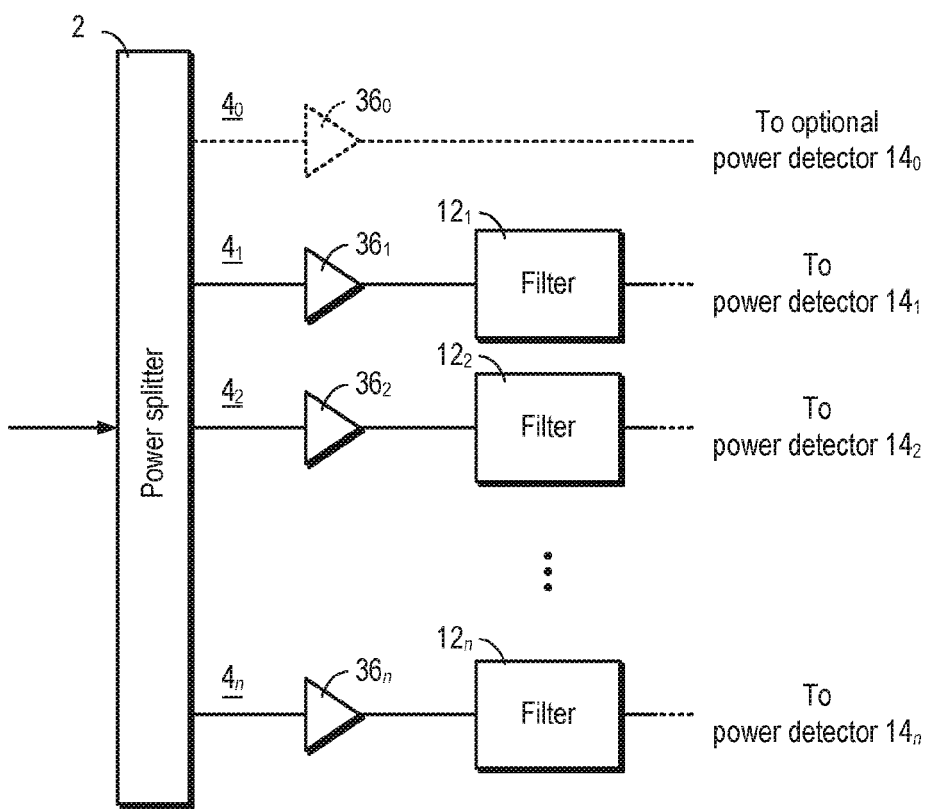
FIG. 10 is a schematic block diagram of a part of a frequency discriminator which includes a plurality of paths, each path including a power-limiting amplifier.

Referring to FIG. 10, each path $4_0, 4_2, \ldots, 4_n$ of the detector 20 may include a respective power-limiting amplifier $36_0, 36_1, 36_2, \ldots, 36_n$ (such as a TriQuint® TGM2543-SM4-20 GHz Limiter/Low Noise Amplifier) arranged between the power splitter 2 and the filters $12_1, 12_2, \ldots, 12_n$.

The gains of the amplifiers $36_0, 36_1, 36_2, \ldots, 36_n$ are set to saturate at a given output level (for example 22 dBm) for an input level which equals or exceeds a given level (for example 10 dBm) and can be adjusted according to the expected or measured signal level. The levels need not be the same for all the amplifiers $36_0, 36_1, 36_2, \ldots, 36_n$. Thus, an amplified signal is provided in each path $4_0, 4_1, 4_2, \ldots, 4_n$ such that most of the dynamic response arises from frequency discrimination.

Referring again to FIGS. 1 and 2, the response $20_1, 20_2, \ldots, 20_n$ of a filter $12_1, 12_2, \ldots, 12_n$ may deteriorate at higher frequencies. In particular, a pass band may become wider and/or transition regions become less clear.

Figure 11:
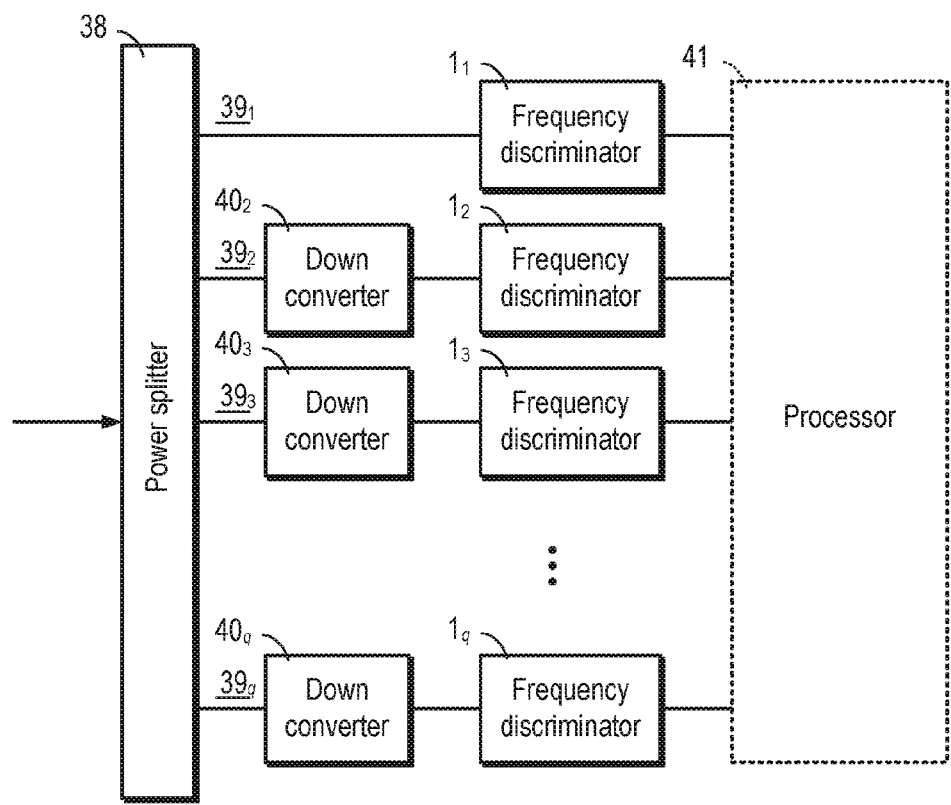
FIG. 11 is a schematic block diagram of part of a frequency discriminator which includes a plurality of paths and a down converter included in at least one path.

Referring to FIG. 11, a frequency discriminator bank 37 is shown which comprises a power splitter 38 which splits an RF signal 3 in q paths $39_1, 39_2, \ldots 39_q$. In a first path $39_1$, the signal is supplied directly to a first frequency discriminator $1_1$. In each of the other paths, the signal is supplied to a respective down converter $40_2, 40_3, \ldots, 40_q$ which shifts the signal down in frequency by a different amount and passes a down-shifted signal to a frequency discriminator $1_2, 1_3, \ldots 1_q$. Thus, each frequency discriminator $1_1, 1_2, 1_3, \ldots, 1_q$ monitors a separate band. The outputs of each frequency discriminator $1_1$, $1_2$, $1_3$, ..., $1_q$ may be passed to a processor 41 for further processing.

The use of down converters can increase bandwidth of sensitivity of the system.

Referring also to FIG. 2, as an example, the first nine filters can be seen to give good coverage of the band between 0 to 3 GHz.

For q=2, using one down converter $40_2$ which shifts frequency by 3 GHz and feeding a down converted signal into a corresponding frequency discriminator $1_2$ allows a band 3 to 6 GHz to be covered so that the total band of sensitivity, with improved performance, is 0 to 6 GHz. For q=3, using an additional down converter $40_3$ which shift frequency by 6 GHz, can allow improved performance over 0 to 9 GHz.

Higher values of q are possible, other values of the individual frequency discriminator bandwidth can be used, and/or other number of filters in each frequency discriminator can be used. For example, using a set of 12 filters capable of covering 0 to 6 GHz and using down converters which shift in multiples of 6 GHz to give a total band of 12 GHz (for q=2), 18 GHz (for q=3), 24 GHz (for q=4) and so on.

Figure 12:
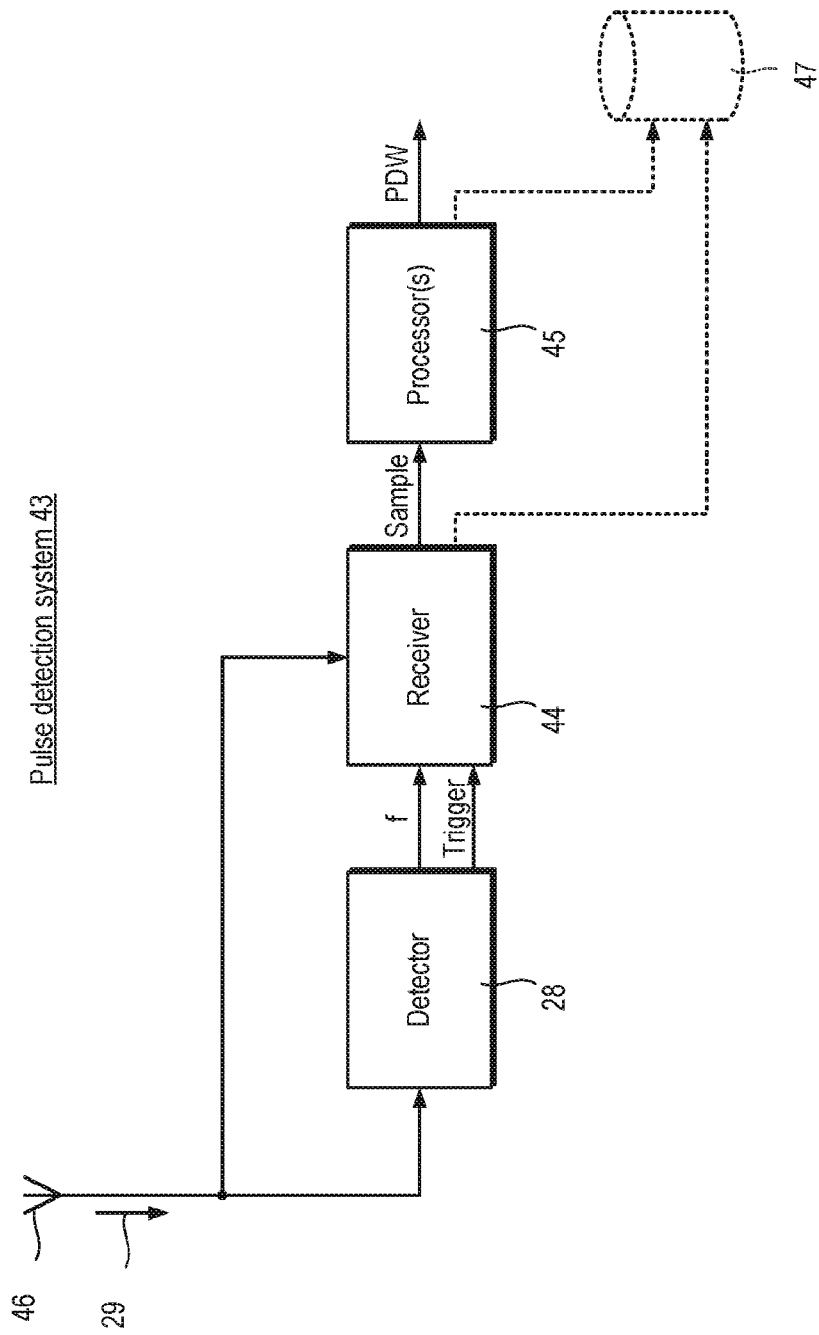
FIG. 12 is a schematic block diagram of a pulse detection system.

Referring to FIG. 12, a pulse detection system 43 is shown.

The system 43 includes a detector 28, a tuneable receiver 44 (such as CRFS® RFeye® Node) and at least one processor 45.

The processor(s) 45 may comprise one or more programmable central processing units (CPUs) capable of executing code read from a non-transitory medium to perform the function and operations taught herein. The processor(s) 45 may be provided by microcontroller(s). The processor(s) 45 may include one or more circuits or circuitry, for example, FPGAs or ASIC(s) configurable or programmable to perform the functions and operations taught herein. The processor(s) 45 may include a combination of one or more programmable CPUs and one or more configurable circuits or circuitry to perform the functions and operations taught herein.

As shown in FIG. 12, an antenna 46 feeds an RF signal 29 to both the detector 28 (which may simply take the form of a discriminator 1 or frequency discriminator bank 37) and the receiver 44.

The detector 28 is wideband and has a high probability of intercept. The receiver 44 has higher sensitivity and good frequency resolution. However, it may have a slower response and lower probability of intercept. The detector 28 can be used to trigger capture of the detected signal 29 by the receiver 44. The receiver 44 can capture the signal by in-phase and quadrature (IQ) time sampling or by spectrum analysis.

On detecting a signal at a particular frequency, $f$, the detector 28 commands the receiver 41 to tune to a band containing that frequency and to capture the remaining part of the signal pulse.

The sample can be fed into the processor(s) 45 to identify the signal and produce a pulse descriptor word (PDW). Characteristics such as pulse repetition rate and pulse width can be measured.

The system 43 may also include storage 47 for storing the captured sample and/or the pulse descriptor word.

Figure 13:
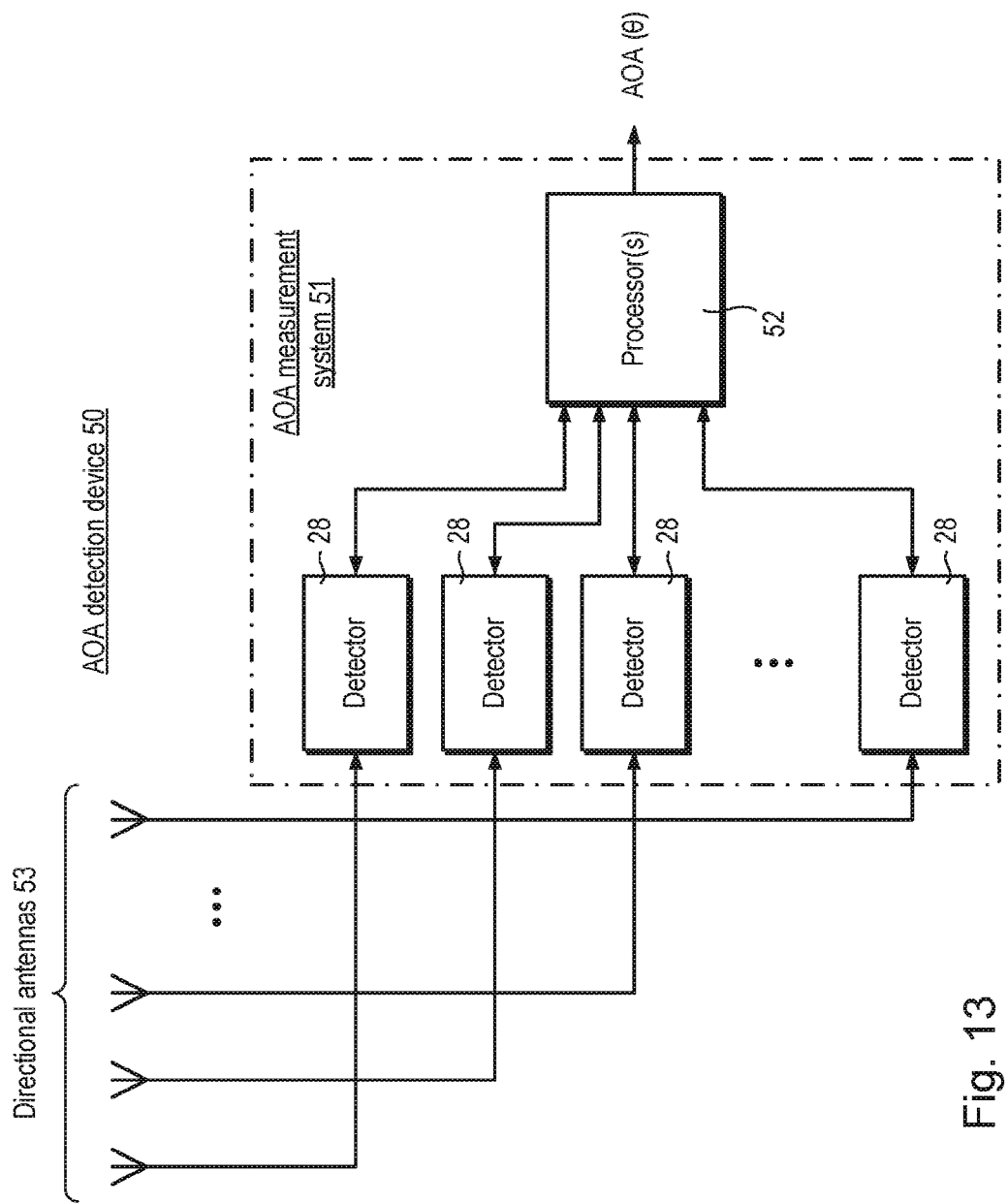
FIG. 13 is a schematic block diagram of an angle-of-arrival (AOA) detection device.

Referring to FIG. 13, an angle-of-arrival (AOA) detection device 50 is shown.

The AOA detection device 50 comprises an AOA measurement system 51 which includes a set of detectors 20 and a processor 52 and a set of directional antennas 53 arranged to provide up to 360-degree around a vertical axis (not shown). There may be 6 or 8 antennas. Each detector 28 is fed by a respective antenna 53.

The processor(s) 52 may comprise one or more programmable CPUs capable of executing code read from a non-transitory medium to perform the function and operations taught herein. The processor(s) 52 may be included in a microcontroller. The processor(s) 52 may include one or more circuits or circuitry, for example, FPGA(s) or ASIC(s) configurable or programmable to perform the functions and operations taught herein. The processor(s) 52 may include a combination of one or more programmable CPUs and one or more configurable circuits or circuitry to perform the functions and operations taught herein.

The detectors 28 operate simultaneously feeding amplitude values into the processor(s) 52. The processor(s) 52 compare the received power levels from each detector 20 to estimate the angle of arrival (AOA) of the signal.

Figure 14:
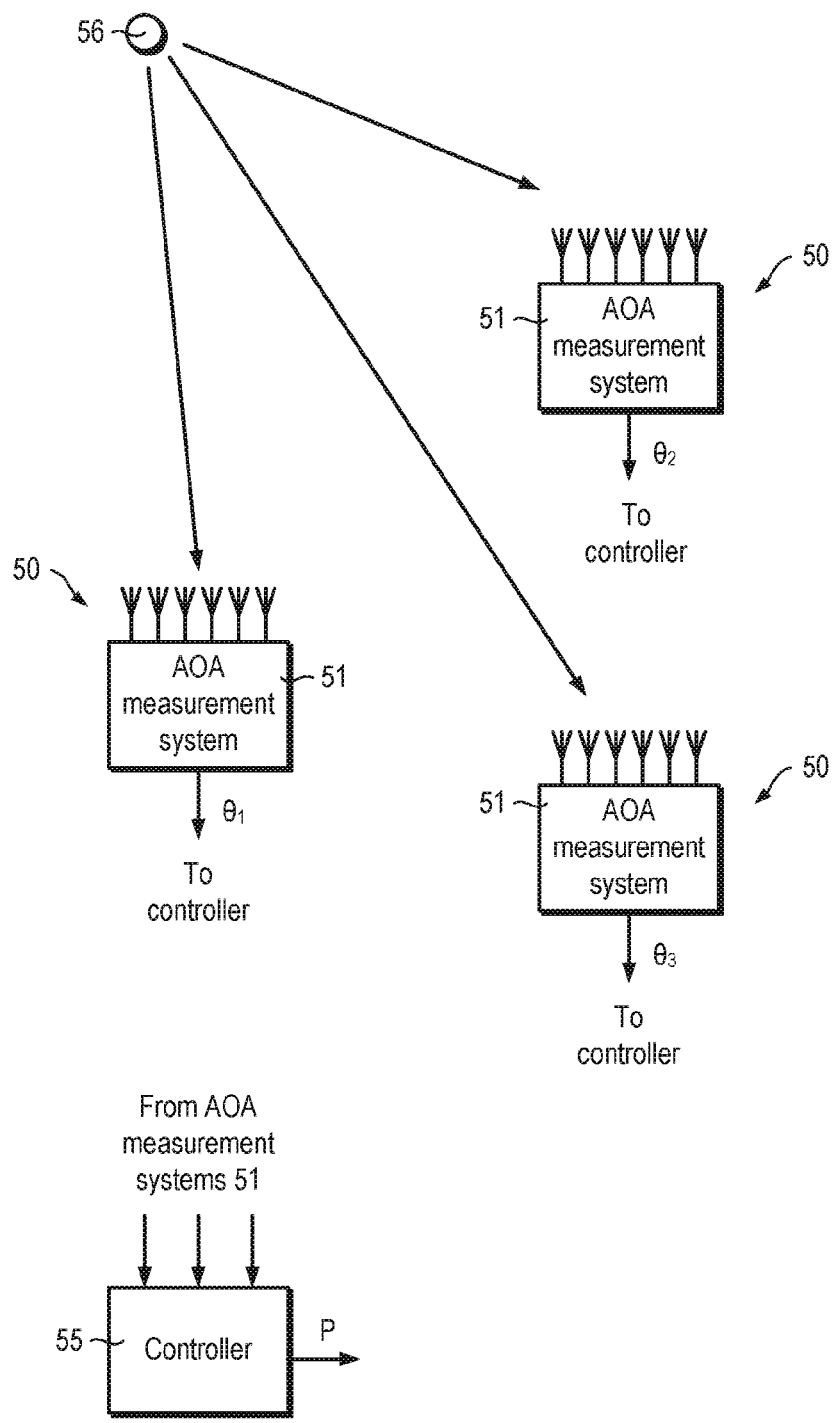
FIG. 14 is a schematic block diagram of an AOA-based positioning system comprising a plurality of AOA detection devices and a controller.

Referring also to FIG. 14, an AOA detection 54 is shown which comprises a network of geographically-distributed AOA detection devices 50 and a controller 55 which can calculate location to provide location, P, of a transmitter 56 by triangulation. The controller 55 can take the form of a computer system, such as a laptop computer or tablet.

The AOA detection devices 50 can transmit values of locally-determined angle, θ, to the controller 55 via a wired (e.g. Ethernet) or wireless (IEEE 802.11) network.

Figure 15:
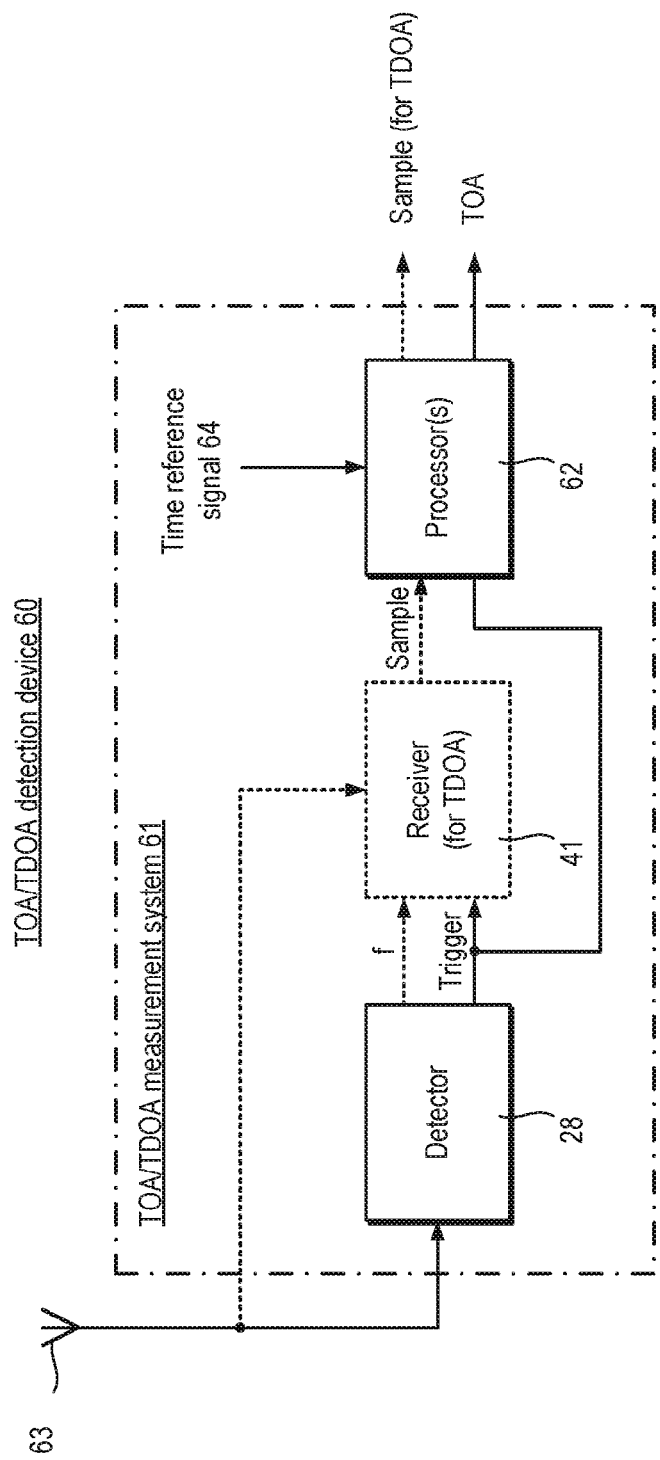
FIG. 15 is a schematic block diagram of a time-of-arrival (TOA) and/or time-difference-of-arrival (TDOA) detection device.

Referring to FIG. 15, a time-of arrival (TOA)/time-difference-of-arrival (TDOA) detection device 60 is shown.

The TOA/TDOA detection device 60 comprises a TOA/TDOA measurement system 61 which includes a detector 28, an optional receiver 41 (for TDOA) and a processor 62, and an antenna 63. The processor 62 receives a time reference signal 64.

The processor(s) 62 may comprise one or more programmable CPUs capable of executing code read from a non-transitory medium to perform the function and operations taught herein. The processor(s) 62 may be provided by microcontroller(s). The processor(s) 62 may include one or more circuits or circuitry, for example, FPGA(s) or ASIC(s) configurable or programmable to perform the functions and operations taught herein. The processor(s) 62 may include a combination of one or more programmable CPUs and one or more configurable circuits or circuitry to perform the functions and operations taught herein.

For a time-of-arrival (TOA) measurement, when a signal is detected, the detector 28 sends a trigger to the processor(s) 62 which records the time of arrival of the signal.

For a time-difference-of-arrival (TDOA) measurement, when a signal is detected, the detector 28 commands the receiver 41 to capture a sample of the signal or the remaining part of the signal. The receiver 41 feeds the sample (for example in the form of a time series) to the processor(s) 62.

The device 60 may be configured to perform TOA, TDOA or TOA and TDOA.

The device 60 may be switchable between first, second and third modes in which it performs TOA, TDOA or TOA and TDOA respectively.

The device may be able to perform other types of measurement, such as AOA.

Figure 16:
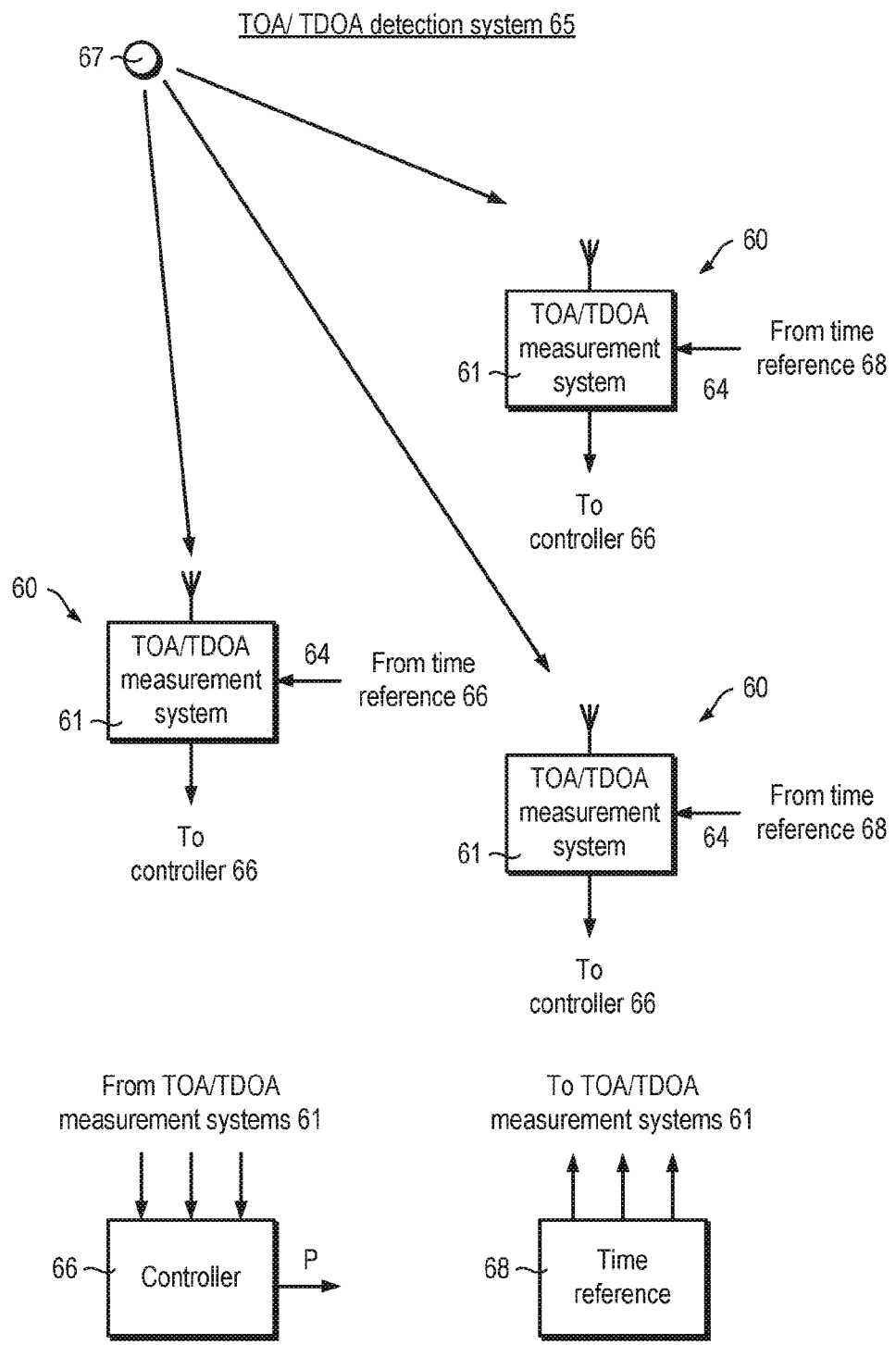
FIG. 16 is a schematic block diagram of a positioning system comprising a plurality of TOA and/or TDOA detection devices and a controller.

Referring also to FIG. 16, a TOA/TDOA detection system 65 is shown which comprises a network of geographically-distributed TOA/TDOA detection devices 60, a controller 66 which can calculate location to provide location, P, of a transmitter 67 by trilateration, and a time reference 68 which transmits a time reference signal 64. The controller 66 can take the form of a computer system, such as a laptop computer or tablet.

The TOA/TDOA detection devices 60 can transmit values of locally-determined TOA and/or a locally-captured signal sample to the controller 66 via a wired (e.g. Ethernet) or wireless (IEEE 802.11) network.

For TOA, the controller 66 determines a sphere of possible locations from each value of TOA (based on the location of the device) and can use a value of TOA from three or more devices to determine the location of the source.

For TDOA, the controller 66 performs correlation analysis on pairs of captured time series and determines a hyperbolic function for a pair of measurements. By using two or more pairs of measurements, intersection(s) of hyperbolas is (are) used to determine the location of the source.

The GPS or other positioning system can be used as time reference 68.

In secure, restricted or other sensitive environments in which use of communication devices is prohibited or controlled (such as in a prison or hospital), there may be a need to detect and locate unauthorised transmitters, such as mobile phones.

Monitoring or geo-location systems based on POA or TDOA can be difficult to implement successfully due to the challenging propagation characteristics of a building, such as the fact that there are a large number of rooms, the presence of thick walls, and the use of metal doors, gates and wall-reinforcements.

Figure 17:
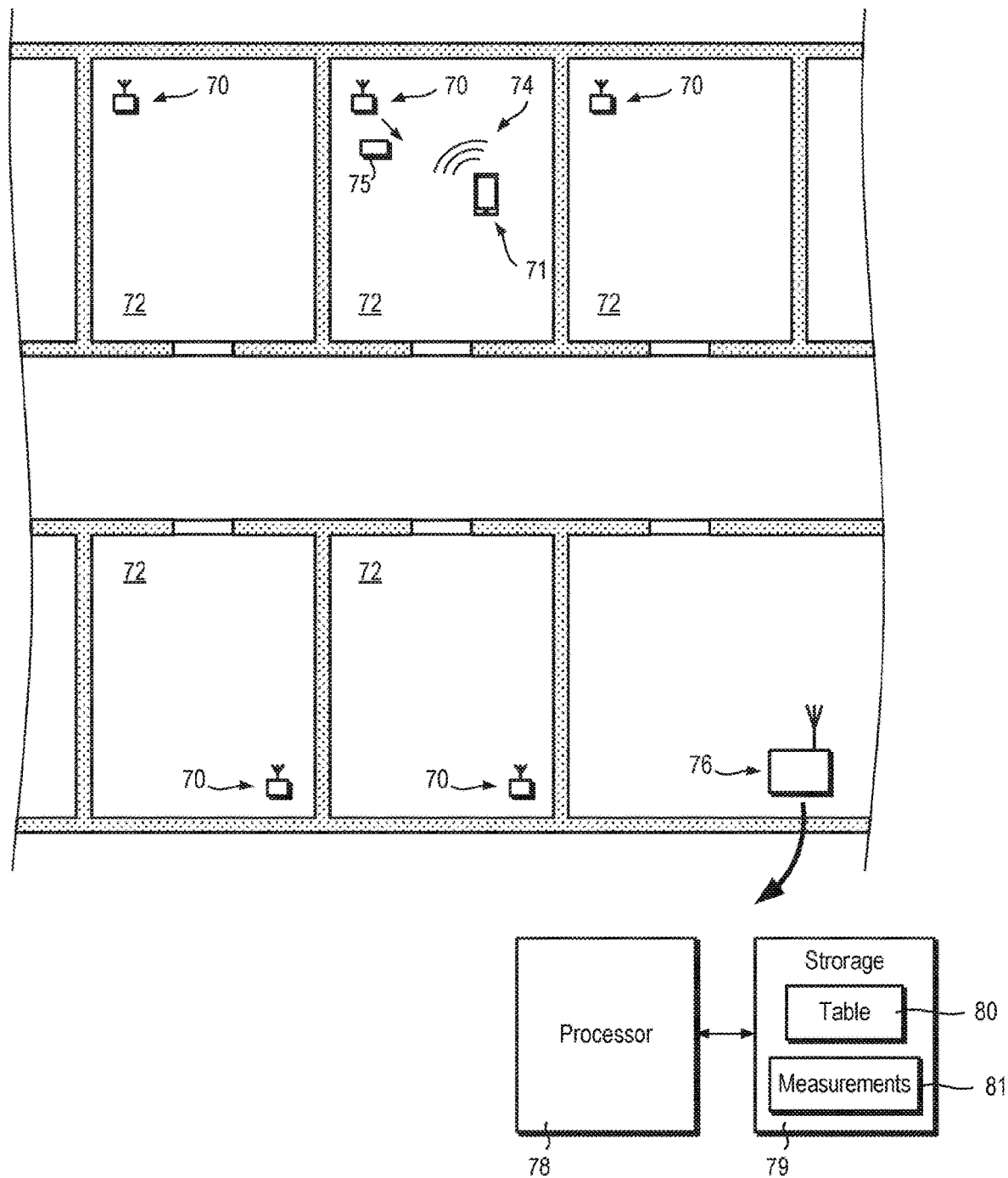
FIG. 17 is schematic diagram of a system for detecting and locating unauthorised rf transmitters comprising a plurality of spaced low-power radio-frequency detectors.

Referring to FIG. 17, a frequency discriminator 1 (FIG. 1) can form part of a sensor 70 which is used to listen for, detect and locate unauthorised transmitters, such as a mobile phone 71. A sensor 70 is placed in each room 72 and is assigned a unique identifier 73 (FIG. 17). If a sensor 70 detects a signal 74, it transmits a report 75 to a central unit 76 including its unique identifier 73 (FIG. 17), thereby identifying itself and, thus, the room 72 in which it is located. The report 75 can also include measured signal characteristics 77, such as pulse width, pulse repetition rate and frequency band.

The central unit 76 includes a processor 78 and storage 79 which contains a table 80 listing detector identifiers 73 and corresponding locations of the detector 70. It can also store reports 75.

Figure 18:
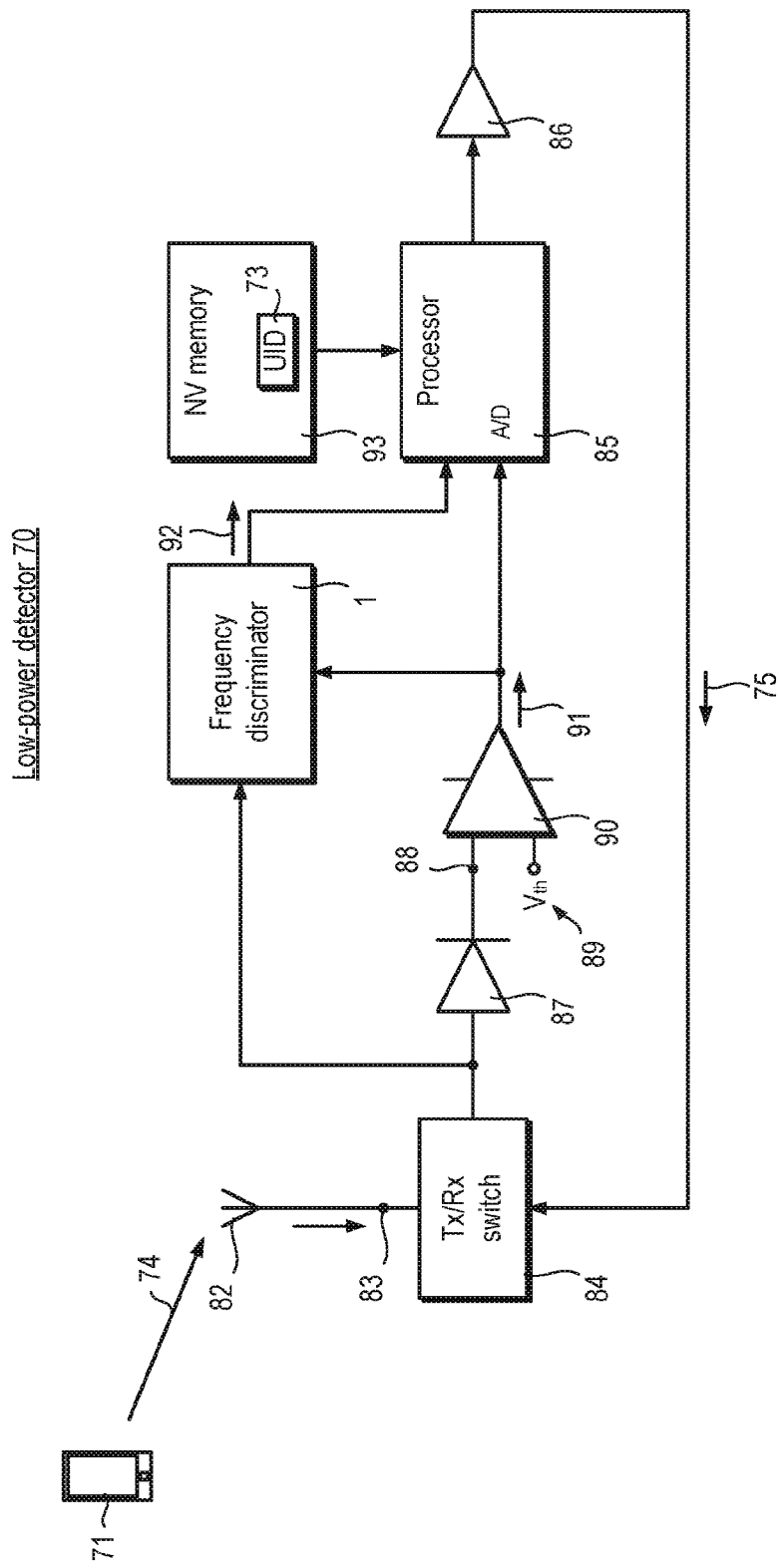
FIG. 18 is a schematic block diagram of the detector shown in FIG. 17.

Referring to FIG. 18, the detector 70 is shown in more detail. The detector 70 is powered by a battery (not shown) and so no external power supply is required. However, the detector 70 may be connected to an external power supply, for example, so as to be trickle charged.

The detector 70 includes a wideband antenna 82 connected via a terminal 83 to a transmit/receive switch 84.

In a quiescent state, the detector 70 is set to receive and so a wideband detector 1, microprocessor 85 and transmit amplifier 86 are in a sleep state, i.e. very low power consumption state.

RF radiation (i.e. signal 74) incident on the antenna 82 is passed to a diode detector 87. The diode 87 is a passive device and so does not require input power. The output 88 of the diode 87 is compared to a reference voltage 89 by a low-power comparator 90. If the diode output 88 exceeds the reference voltage 89, the output 91 of the comparator 90 acts as a 'wake-up' signal.

The microprocessor 85 and wideband detector 1 become active. The wideband detector 1 estimates the signal frequency, while the microprocessor 85 measures other signal characteristics, such as pulse width and time between pulses. The wideband detector 1 passes its results 92 to the microprocessor 79.

The microprocessor 85 accesses non-volatile memory 93 which stores a unique identifier 73. The unique identifier 73 is different for each sensor 70. Upon detection of a signal 74, the microprocessor 85 sets the transmit/receive switch 84 to transmit mode, and prepares and transmits a report 75 which includes the identifier 73 and frequency and pulse time information 92 via the switch 84 and antenna 82.

The report 75 is transmitted, optionally via one or more nodes (not shown) to the central unit 76 (FIG. 17). A processor 78 (FIG. 17) determines the sensor location by identifying the received sensor identifier 73 and looking up the location in the table 80.

The low power nature of the system means that the sensors 70 can be deployed with wiring into the existing power supply. Low-power data transmission methods can be used, such as BLE (Bluetooth Low Energy).

The diode output 82 can additionally be routed to the analogue-to-digital input. This can be used to derive additional information concerning the received signal power level.

The transmit/receive switch 84 may be omitted and a second antenna (not shown) may be provided for transmitting signals. In that case, the wideband antenna 82 feeds directly into the diode 87 and the transmit amplifier 86 feeds the second antenna.

Figure 19:
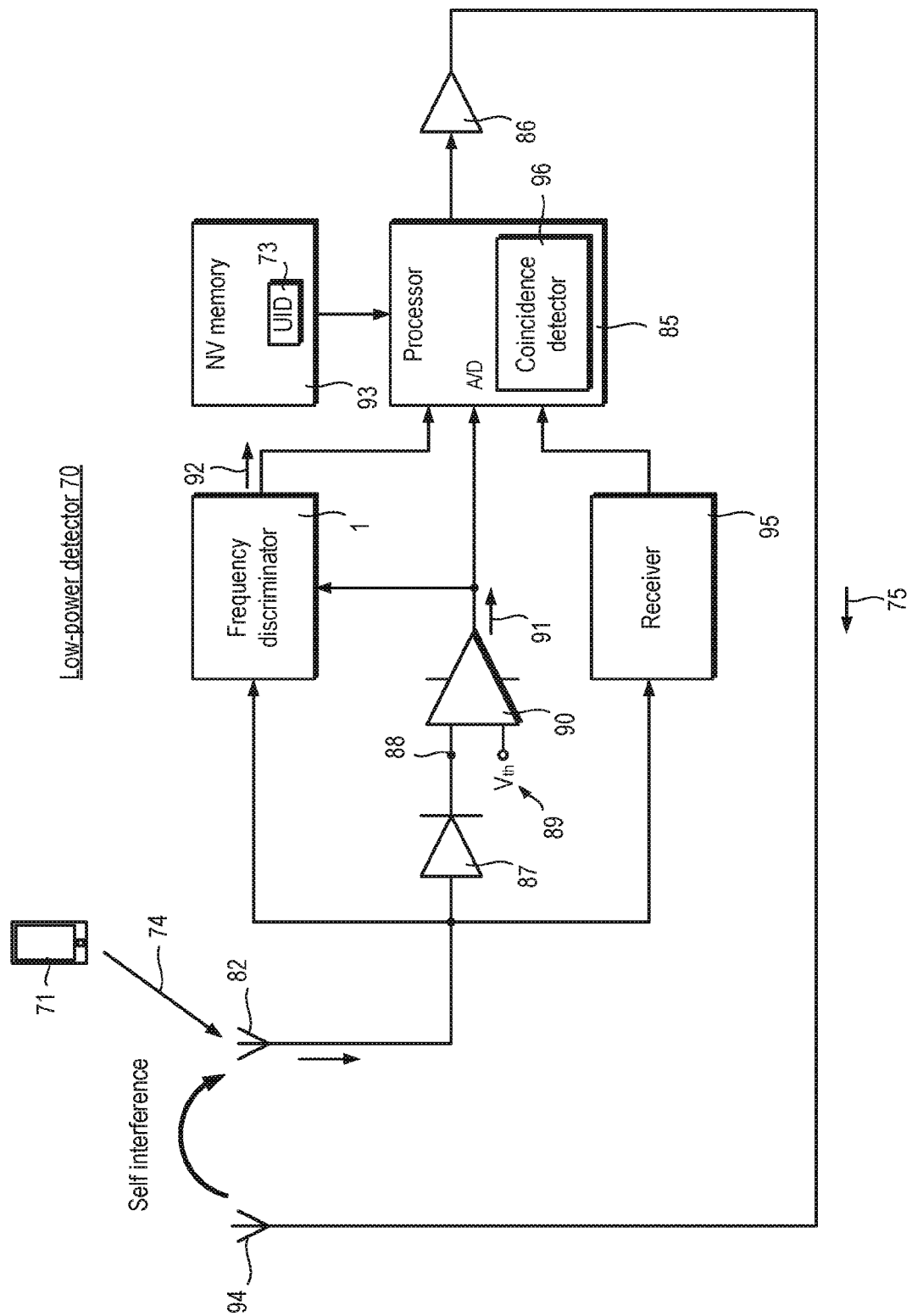
FIG. 19 is a schematic block diagram of a system for detecting self-interference.

Referring to FIG. 19, the detector 70 may be modified by omitting transmit/receive switch 84 and providing a separate antenna 94 for wirelessly transmitting the report 75 and an rf receiver 95 coupled to the receive antenna 82. The processor 85 includes a self-collision module 96 which arranged to determine whether the detected frequency is the same as the frequency of transmission used to transmit the report 75. If self-interference is detected, then the self-collision module 96 may issue a signal (not shown) supressing transmission of a further report.

It will be appreciated that many modifications may be made to the embodiments hereinbefore described.

For example, n may be higher or lower. For example, n may be equal to or greater than 6, equal to or greater than 8 or equal to or greater than 10. For example, n may be equal to or less than 24, equal to or less than 20, equal to or less than 18 or equal to or less than 16.

For example, the frequency covered by a set of filters may be narrower or wider.

The invention claimed is:

1. A frequency discriminator comprising a power splitter for splitting a signal into a plurality of paths, wherein at least two of the plurality of paths include respective filters having different frequency characteristics which are configured to provide respective filtered signals to respective power detectors, the frequency discriminator further comprising an analogue-to-digital conversion section, wherein the analogue-to-digital conversion section is configured to receive values of measured powers from the power detectors, to generate digital values of measured powers and to provide the digital values of measured powers to a digital processing section, wherein the digital processing section is configured to estimate a value of at least one frequency in the signal in dependence on at least one ratio of digital values of measured powers and on frequency responses of the filters.

2. A frequency discriminator according to claim 1, wherein the plurality of paths includes a frequency-independent path to a respective power detector.

3. A frequency discriminator according to claim 1, wherein the power detectors comprise logarithmic power detectors.

4. A frequency discriminator according to claim 1, further comprising a plurality of sample-and-hold circuits, wherein each path is provided with a respective sample-and-hold circuit which is configured to obtain a value of measured power from a respective power detector and to provide the value to the analogue-to-digital conversion section.

5. A frequency discriminator according to claim 1, wherein the analogue-to-digital conversion section comprises a plurality of analogue-to-digital converters, each path provided with a respective analogue-to-digital converter.

6. A frequency discriminator according to claim 1, wherein the analogue-to-digital conversion section comprises an analogue-to-digital converter and a multiplexer having a plurality of inputs and an output, wherein the inputs are coupled to the plurality of paths and the output is coupled to an input of the analogue to digital converter.

7. A frequency discriminator according to claim 1, wherein the digital processing section is configured to find a filtered signal having a maximum measured power, the filtered signal corresponding to a frequency band and having a first filtered signal(s) in a first neighbouring frequency band.

8. A frequency discriminator according to claim 7, wherein the digital processing section is configured to fit measured powers to the frequency responses of the filters so as to result in an error between the measured power and the frequency response, to minimise the error so as to identify the value of at least one frequency.

9. A frequency discriminator according to claim 8, wherein the digital processing section is configured to fit measured powers for the filtered signal and for the first filtered signals.

10. A frequency discriminator according to claim 7, wherein the digital processing section is configured to select one of the first filtered signal(s) and to use an inverse transform of the frequency responses to identify the value of the frequency.

11. A frequency discriminator according to claim 1, wherein each path includes an amplifier arranged to saturate for signals above a given signal level.

12. A detector, comprising:
at least one frequency discriminator according to claim 1; and
an optional circuit configured to process signal(s) from the at least one frequency discriminator.

13. A detector, comprising:
at least two frequency discriminators according to claim 1; and
a power splitter for splitting a signal into at least two detector paths, each detector path including one of the at least two frequency discriminators.

14. A detector according to claim 13, comprising at least one down converter, wherein at least one of the plurality of detector paths includes a respective down converter which is configured to provide a down converted signal to a respective frequency discriminator.

15. A detector according to claim 12, further comprising an input section comprising at least one of a high-pass filter and a power limiter.

16. A system comprising:
a detector according to claim 12; and
a receiver;
wherein the detector is configured, in response to receiving a signal which includes component at a predetermined frequency, to identify the frequency and to cause the receiver to tune to a frequency band which includes the frequency.

17. A system according to claim 16, further comprising:
at least one further processor configured to characterise the signal and, in response to characterising the signal, to generate a pulse descriptor word.

18. A system according to claim 16, further comprising:
at least one antenna coupled to the detector and the receiver.

19. A system according to claim 16, which is a radar warning receiver system.

20. A detection device comprising:
at least two detectors according to claim 12, each detector arranged to output a corresponding power level of an input signal; and
a processor configured to receive at least two measurements of power levels from respective frequency discriminators and to determine an angle of arrival.

21. A detection device according to claim 20, further comprising;
at least two antennas, each antenna coupled to a respective detector.

22. A system comprising:
a plurality of spaced detection devices according to claim 20; and
a controller for receiving measurements of angle of arrival from one or more detection devices and which is configured to determine position of a signal source from measurements of angle of arrival.

23. A detection device comprising:
a detector according to claim 12; and
at least one processor configured to measure a time of arrival of a pulse received by the frequency discriminator.

24. A system comprising:
a plurality of spaced detection devices according to claim 23; and
a controller for receiving measurements of time of arrival from one or more detection devices and which is configured to determine position of a signal source from measurements of time of arrival.

25. A detection device comprising:
a detector according to claim 12;
a receiver for capturing a sample of a signal; and
at least one processor,
wherein the detector is configured, in response to receiving a signal, to cause the receiver to capture a sample of the signal.

26. A detection device according to claim 25, wherein the at least one processor is configured to measure a time of arrival of a pulse received by the detector.

27. A system comprising:
a plurality of spaced detection devices according to claim 25; and
a controller for receiving samples from one or more detection devices and which is configured to determine position of a signal source from the sample using time difference of arrival.

28. A system according to claim 27, wherein the at least one processor is configured to measure a time of arrival of a pulse received by the detector,
wherein the controller is configured to determine position of the signal source from measurements of time of arrival.

29. A detector, comprising:
an input terminal;
a processor;
memory storing a unique identifier;
a transmitter;
at least one frequency discriminator according to claim 1 configured to receive a signal from the input terminal and to output an instantaneous frequency signal to the processor;
a diode configured to receive the signal from the input terminal;
a comparator configured to compare an output of the diode with a threshold and, in dependence upon determining that the diode output exceeds the threshold, to output a wake-up signal to the processor and frequency discriminator;
wherein the processor is configured, in response to receiving the wake-up signal, to cause the transmitter to transmit the unique identifier and a value of frequency based on the instantaneous frequency signal.

30. A detector according to claim 29, further comprising: an antenna coupled to the input terminal.

31. A detector according to claim 29, wherein the transmitter comprises an amplifier.

32. A detector according to claim 29, further comprising: a transmit/receive switch.

33. A system comprising:
at least one detector according to claim 29; and
a central unit in communication with the at least one detector and configured to process a signal received from a one detector.

34. A system according to claim 33, comprising at least two detectors which are spaced apart.

35. A frequency discriminator according to claim 1, wherein the digital processing section is configured to find a filtered signal having a maximum measured power, the filtered signal corresponding to a frequency band and having first and second filtered signals in first and second neighbouring frequency bands.

36. A frequency discriminator according to claim 35, wherein the digital processing section is configured to fit measured powers to the frequency responses of the filters so as to result in an error between the measured power and the frequency response, to minimise the error so as to identify the value of at least one frequency.

37. A frequency discriminator according to claim 36, wherein the digital processing section is configured to fit measured powers for the filtered signal and for the first and second filtered signals.

38. A frequency discriminator according to claim 35, wherein the digital processing section is configured to select one of the first and second filtered signals and to use an inverse transform of the frequency responses to identify the value of the frequency.

* * * * *